United States Patent
Chen et al.

(10) Patent No.: US 6,365,471 B1
(45) Date of Patent: Apr. 2, 2002

(54) METHOD FOR PRODUCING PMOS DEVICES

(75) Inventors: Coming Chen, Yang Mai Chen; Sun-Jay Chang, Lu-Yeh Hsiang, both of (TW)

(73) Assignee: United Microelectronics Corp., Taiwan (*) Notice: Subject to any disclaimer, the term of this patent is extended or adjusted under 35 U.S.C. 154(b) by 0 days.

(21) Appl. No.: 09/336,871

(22) Filed: Jun. 18, 1999

(51) Int. Cl.[7] .............................................. H01L 21/336
(52) U.S. Cl. ........................ 438/301; 438/229; 438/184
(58) Field of Search .................................. 438/229, 230, 438/231, 257, 184, 185, 301, 303, 305

(56) References Cited

U.S. PATENT DOCUMENTS

| | | | |
|---|---|---|---|
| 5,045,486 A | * 9/1991 | Chittipeddi et al. | 437/41 |
| 5,411,906 A | * 5/1995 | Johnson et al. | 437/44 |
| 5,472,896 A | * 12/1995 | Chen et al. | 437/44 |
| 5,759,901 A | * 6/1998 | Loh et al. | 438/305 |
| 5,895,955 A | * 4/1999 | Gardner et al. | 257/336 |
| 5,899,721 A | * 5/1999 | Gardner et al. | 438/303 |
| 5,952,706 A | * 9/1999 | Bashir | 257/587 |
| 6,117,719 A | * 9/2000 | Luning et al. | 438/230 |

OTHER PUBLICATIONS

Wolf, Stanley. "Silicon Processign for the VLSI Era", vol. 2, Process Integration, pp. 154–155, 1990.*

* cited by examiner

Primary Examiner—Matthew Smith
Assistant Examiner—Renzo Rocchegiani

(57) ABSTRACT

A method for preventing boron segregation and out diffusion to form PMOS devices is disclosed. The method includes providing a semiconductor substrates and the formation of a gate oxider layer as well as a gate layer on top of the semiconductor substrate. Next, a photoresist layer is formed on a top surface of the gate layer, moreover, a pattern is transferred onto the photoresist layer after being put through an exposure and a development. Furthermore, the gate layer and the oxide layer are then etched using the photoresist layer as a mask, and the photoresist layer is removed afterward. In succession, a thin silicon nitride layer is grown utilizing RTCVD processing. Thereafter, high doped drain regions of boron ion shallow junctions are formed by carrying out ion implantation. A silicon oxide layer is deposited using LPCVD, and forming spacers by etching the silicon oxide layer. Next, a heavy doping of boron ions proceeds, as well as an annealing process. The thin silicon nitride layer is etched using diluted phosphoric acid solution. The final stage is the formulation of metal silicides.

6 Claims, 5 Drawing Sheets

METHOD FOR PRODUCING PMOS DEVICES

BACKGROUND OF THE INVENTION

1. Field of the Invention

The present invention generally relates to a method for producing PMOS devices, and more particularly to a method for preventing boron segregation and out diffusion in the production of PMOS devices.

2. Description of the Prior Art

Continuous expansion of integrated circuit density requires chip area to be maintained or even become smaller in order to reduce circuit unit cost. The only solution to this is an endless diminishment of design rule. Moreover, once devices shrink in size, the degree of shrinkage in gate sizes is even greater than other design rules, and this is mainly because of the need to take the device efficiency into consideration. The junctions of the source/drain regions must be shallow enough to avoid short channel effect when devices shrink in size. Therefore, boron ions (boron or boron fluoride) with low energy and high dosage must be used, and shallow junctions of PMOS devices are formed by carrying out ion implantation. But thermal diffusion might occur inside the silicon wafer that is caused by the implanted boron ions during a follow-up annealing process. This results in low resistivity source/drain regions and high driving current because the boron ion density closest to the wafer's surface is decreased. Furthermore, semiconductor device performance is worsened.

SUMMARY OF THE INVENTION

In accordance with the present invention, a method is provided for forming PMOS devices that substantially prevents boron segregation and out diffusion.

It is an object of the present invention to provide a method to prevent boron segregation and out diffusion for producing PMOS devices, because a thin silicon nitride layer is formed using rapid thermal chemical vapor deposition in the present invention. Although a crystallized structure on the silicon wafer's surface can be recovered during a follow-up annealing process, thermal diffusion might occur inside the silicon wafer that is caused by the implanted boron ions. Hence, the boron ion density closest to the wafer's surface will be decreased. By means of the formation of this thin silicon nitride layer, reduction of boron ion density close to the surfaces of source/drain regions due to thermal diffusion can be effectively prevented during the annealing process. Therefore, the boron ion density closest to the wafer's surface can be maintained.

It is another object of the present invention to provide a method of low resistivity source/drain regions and high driving current for producing PMOS devices by a thin silicon nitride layer formed by using rapid thermal chemical vapor deposition. Moreover, during a follow-up annealing process, thermal diffusion might occur inside the silicon wafer that is caused by the implanted boron ions. Hence, the boron ion density close to the wafer's surface will be decreased and thid will result in higher resistivity and lower driving current. By means of the formation of this thin silicon nitride layer, the boron ion dens loses to the wafer's surface can be maintained, resulting in low resistivity source/drain regions and high driving current, furthermore, semiconductor device performance is improved.

It is a further object of the present invention to provide a method that effectively reduces fringing capacitance for producing PMOS devices. Fringing capacitance can be effectively reduced after the removal of this silicon nitride layer, resulting in an improvement in semiconductor performance.

In one embodiment, a method for preventing boron segregation and out diffusion is provided. First of all, a semiconductor substrate is provided and a gate oxide layer as formed as well as a gate layer on top of the semiconductor substrate. Next, a photoresist layer is formed on a top surface of the gate layer. Moreover, a pattern is transferred onto the photoresist layer after undergoing an exposure and a development. Furthermore, the gate layer and the gate oxide layer are then etched using the photoresist layer as a mask, and the photoresist layer is removed afterward. In sucession, a thin silicon nitride layer is grown by utilizing rapid thermal chemical-vapor-deposition (RTCVD) processing.

Thereafter, high doped drain regions of boron ion shallow junctions are formed by carrying out ion implantation. A silicon oxide layer is deposited by using low pressure chemical vapor deposition (LPCVD), and spacers are formed by etching the silicon oxide layer. Next, heavily doping of boron ions proceeds, as well as an annealing process. The thin silicon nitride layer is etched using a diluted phosphoric acid solution. The final stage is a procedure of forming metal silicides.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
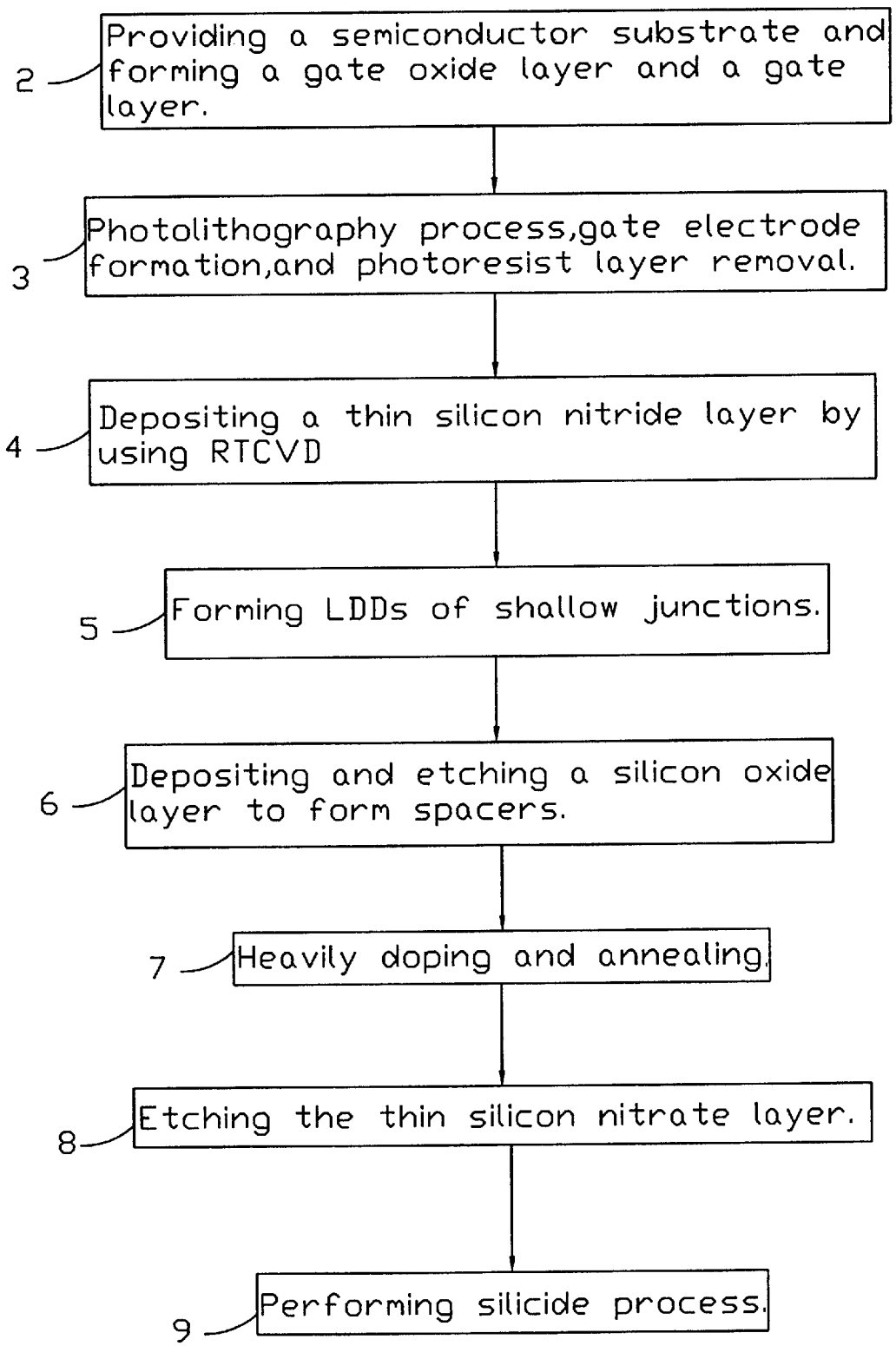
FIG. 1 is a flow diagram showing the key steps for producing PMOS devices for preventing boron segregation and out diffusion in according with a method disclosed herein.

Referring to FIG. 1 and in accordance with a method in preventing boron segregation and out diffusion that has been provided by the present specification in the form of a flowchart showing the key steps of a preferred embodiment of the present invention. First of all, stage 2 provides a semiconductor substrate and the formation of a gate oxide layer as well as a gate layer on top of the semiconductor substrate. Next, in stage 3, a photoresist layer is formed on a top surface of the gate layer, moreover, a pattern is transferred onto the photoresist layer after undergoing an exposure and a development. Furthermore, the gate layer and the gate oxide layer are then etched by using the photoresist layer as a mask, and the photoresist layer is removed afterward.

In succession, stage 4 utilizes rapid thermal chemical-vapor-deposition (RTCVD) processing to grow a thin silicon nitride layer. Hereafter, in stage 5, high doped drain regions of boron ion shallow junctions are formed by carrying out ion implantation. Stage 6 uses low pressure chemical vapor deposition (LPCVD) to deposit a silicon oxide layer, and spacers are formed by etching the silicon oxide layer. Next, in stage 7, heavily doped of boron ions has been proceeded, as well as an annealing process. Stage 8 uses diluted phosphoric acid solution to etch the thin silicon nitride layer. The final stage, stage 9, is a procedure for forming metal silicides.

Referring to FIGS. 2A–2J, the process flow of a preferred embodiment according to the procedure mentioned in FIG. 1 is depicted in cross-sectional views. These drawings merely show several key steps in sequential processes.

First of all, a semiconductor substrate 10, which is a silicon substrate and has N-type conductivity, is delivered into an oxidation furnace tube. The silicon oxide on a surface of the substrate is then transferred to a layer of silicon dioxide having a thickness in between about 100 angstroms and about 250 angstroms by using dry oxidation method. This silicon dioxide layer will be used as a gate oxide layer 11 for semiconductor devices. Sequentially, a polysilicon layer 12 having a thickness in between about 2000 angstroms and about 3000 angstroms is deposited on top of silicon dioxide by using chemical vapor deposition. The related temperature control is roughly in between 600 °C. and 650 °C., and the related pressure is about 0.3 to 0.6 torr. The polysilicon layer 12 is then doped with highly dense phosphorus or arsenic using thermal diffusion or ion implantation in order to reduce the resistivity of the gate. This results in a decrease of the "RC time delay" of a gate conductivity layer.

Figure 2A:
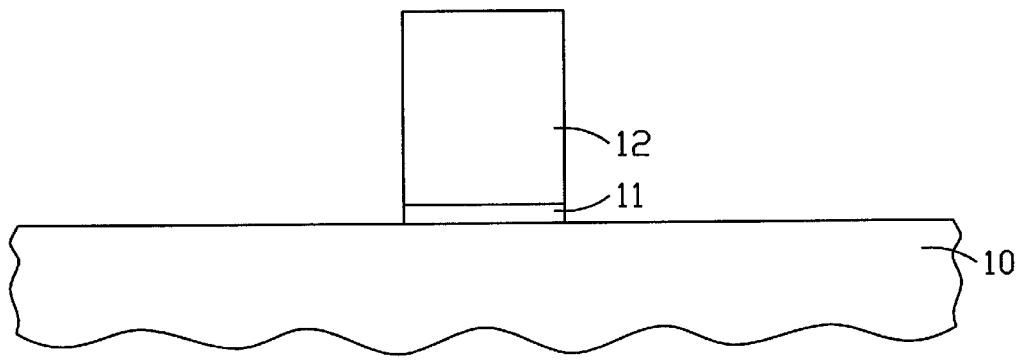
FIGS. 2A to 2J are schematic representations of structures at various stages during the formation of PMOS devices according to the method of this disclosure.

Next, a photoresist layer is deposited over the polysilicon layer. The stepper is used to perform regional exposure in making a perfect transference of the pattern from a mask onto the photoresist layer. Then, a developing procedure for the photoresist layer is carried out to define a size of the gate. The photoresist layer is used as a mask for the etching of the polysilicon layer using self-aligned reactive ion etching to form a gate electrode 12 structure, as well as for the removal of the unwanted gate oxide layer. Last of all, the photoresist layer is removed using either a dry or a wet etching method. The overall structure at the current stage is shown in FIG. 2A.

Figure 2B:
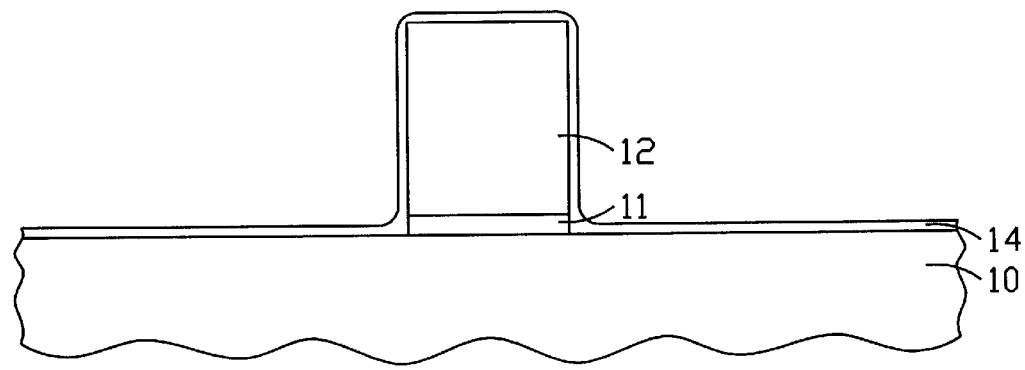

In FIG. 2B, a thin silicon nitride layer 14 is formed on top of semiconductor substrate 10 and gate electrode 12 using rapid thermal chemical vapor deposition, wherein the thickness of silicon nitride layer 14 is in between about 50 angstroms and about 150 angstroms. The formation of silicon nitride layer 14 can also be accomplished using either low pressure chemical vapor deposition (LPCVD) or plasma enhanced chemical vapor deposition (PECVD). This particular layer is formed for the purpose of enhancing boron segregation resistivity. Moreover, during a follow-up annealing process, although a crystallized structure on the silicon wafer's surface can be recovered, thermal diffusion might occur inside the silicon wafer that is caused by the implanted boron ions. Hence, the boron ion density closest to the wafer's surface will be decreased and will result in higher resistivity and lower driving current. By means of the formation of this thin silicon nitride layer, reduction of boron ion density close to the surfaces of source/drain regions due to boron segregation to oxide layer or out diffusion can be effectively prevented during the annealing process. Therefore, the boron ion density close to the wafer's surface can be maintained, resulting in low resistivity source/drain regions and high driving current. Furthermore, semiconductor device performance is improved.

Figure 2C:
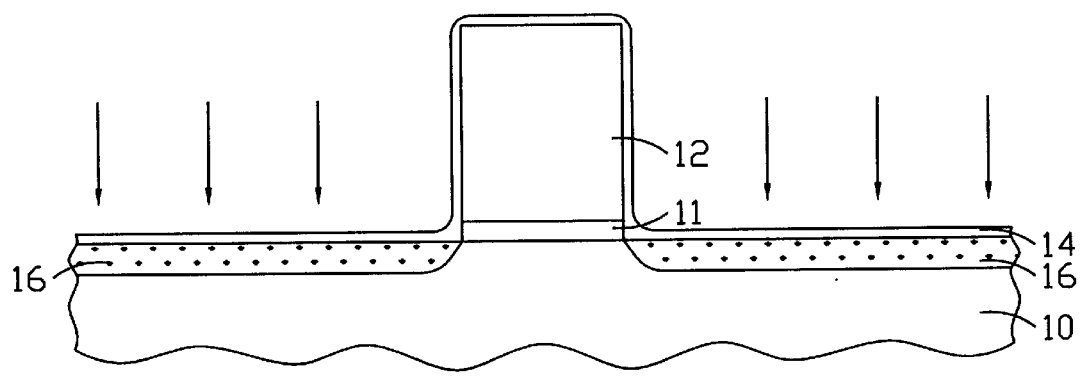

Subsequently, and referring to FIG. 2C, the next procedure is to take the gate electrode 12 as a mask and use boron as an ion source to implant boron ions (boron or boron fluoride) into the entire wafer. The ion implant energy used is roughly in between 0.5 and 8 keV, and the doping density is about $10^{15}$ ions per centimeter square ($10^{15}$ ions/cm$^2$). The above procedure, named PHDD implant, is mainly used to form high doped drain regions (HDDs) 16 that substantially prevent the occurrence of short channel effect. Moreover, due to the usage of low energy, the implant depth by ion implantation inside the semiconductor substrate is shallower, hence the name "shallow junction". It should be pointed out that the procedure of ion implantation of the shallow junction's HDD can be carried out in precedence of the procedure of thin silicon nitride layer deposition. The order of those two procedures will not affect the present invention.

Figure 2D:
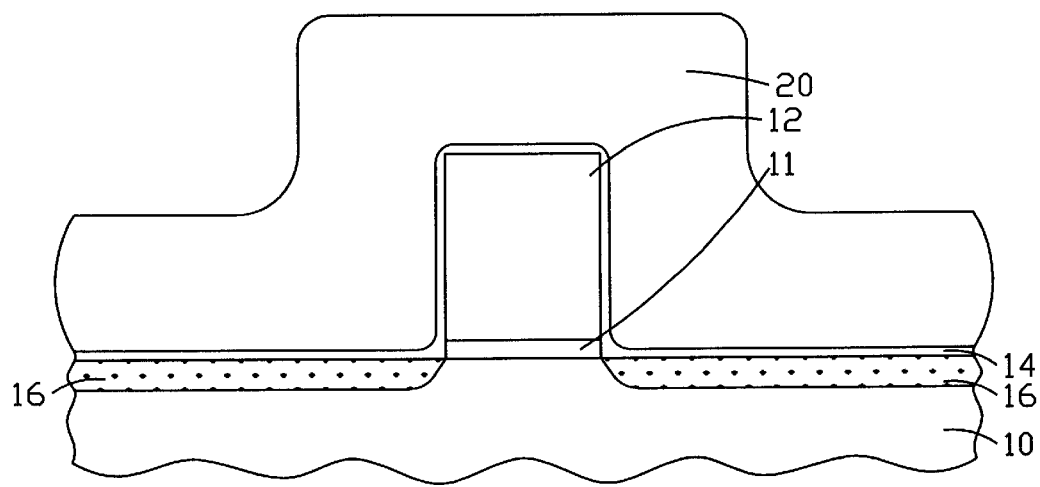
Figure 2E:
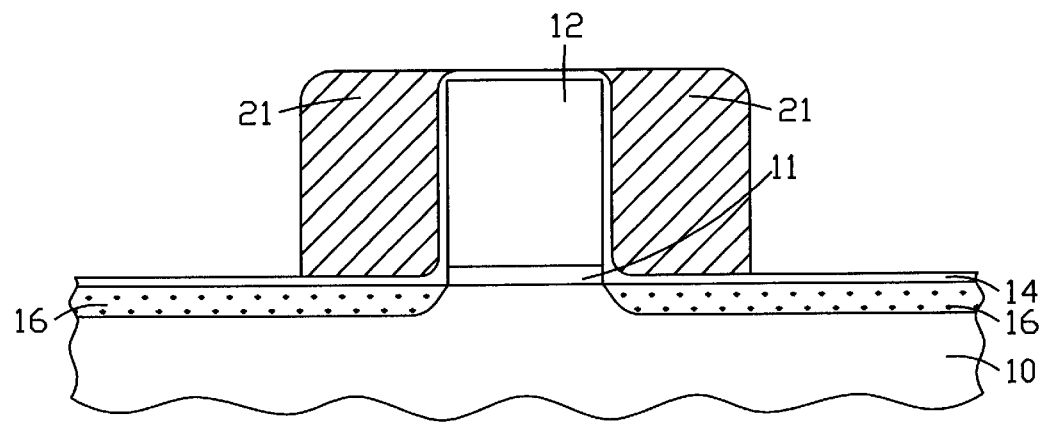

FIG. 2D shows a silicon oxide layer 20 deposited using LPCVD onto the wafer to a thickness in between about 1000 angstroms and 2000 angstroms. Then, in FIG. 2E, silicon oxide layer 20 is etched by applying an anisotropic etching method to form a spacer 21 on a sidewall of gate electrode 12.

Figure 2F:
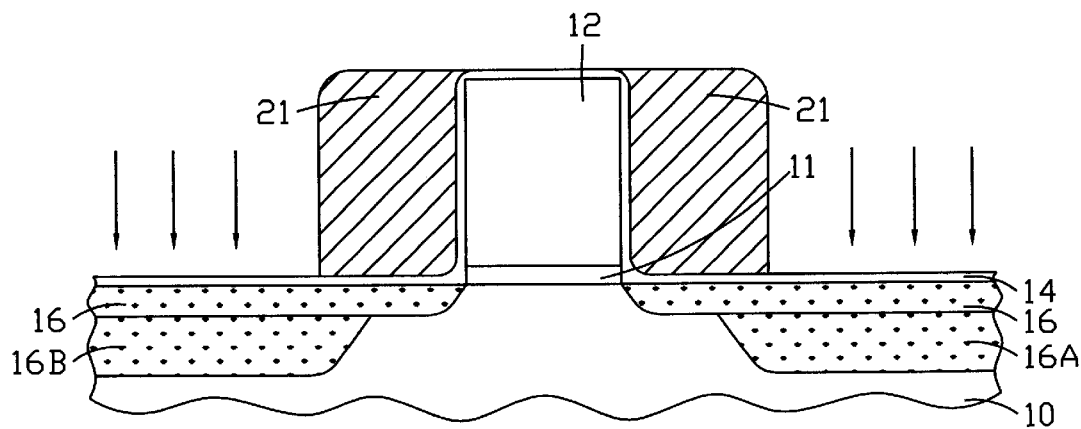
Figure 2G:
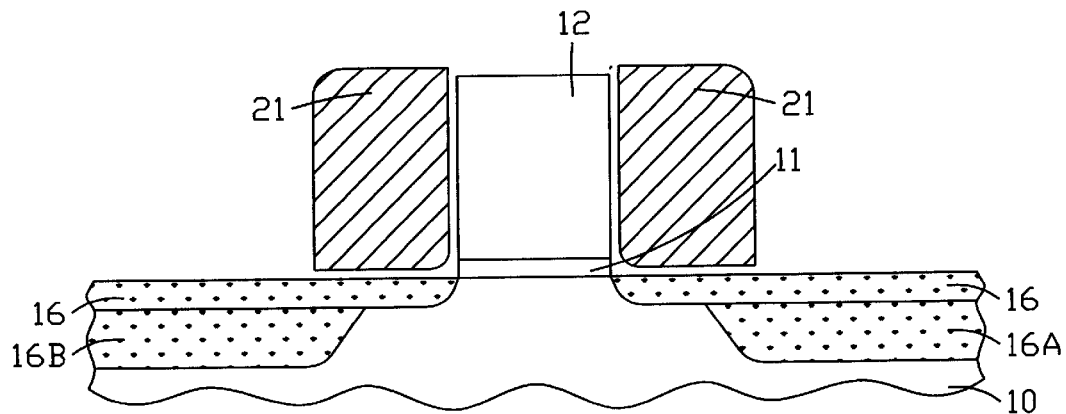

Now referring to FIG. 2F, the heavy doping of a source region 16A and a drain region 16B is performed by using boron (or boron fluoride) as the ion source to carry out a high density and deeper depth ion implantation against the wafer. Next, the resulting wafer is sent into a thermal diffusion furnace to a high temperature ranging from about 900 °C. to about 1000 °C. to perform boron atom diffusion. At the same time, the destroyed portion of boron atoms at the wafer surface due to ion implantation is annealed. Subsequently, as shown in FIG. 2G, diluted phosphoric acid solution is heated and used to peel off the thin silicon nitride layer, wherein the etching rate is approximately 60 angstroms per minute.

Figure 2H:
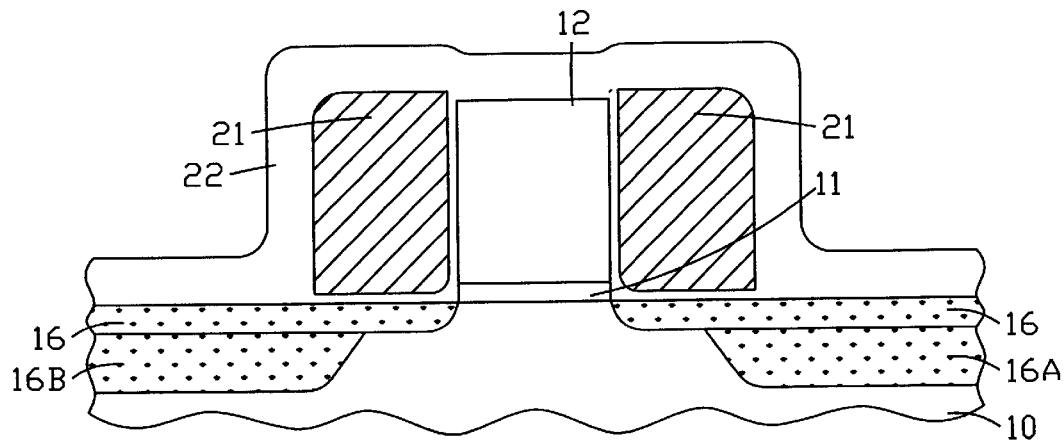
Figure 2I:
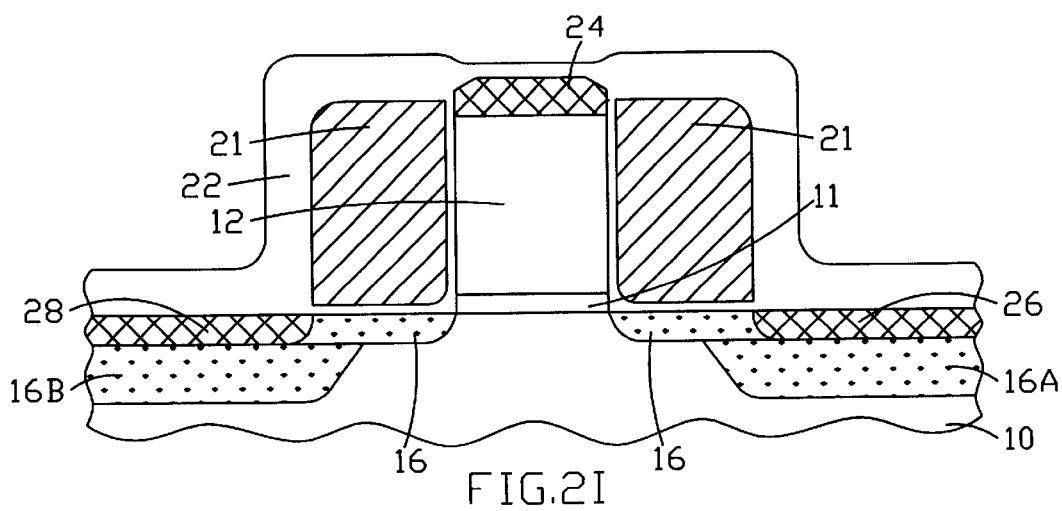
Figure 2J:
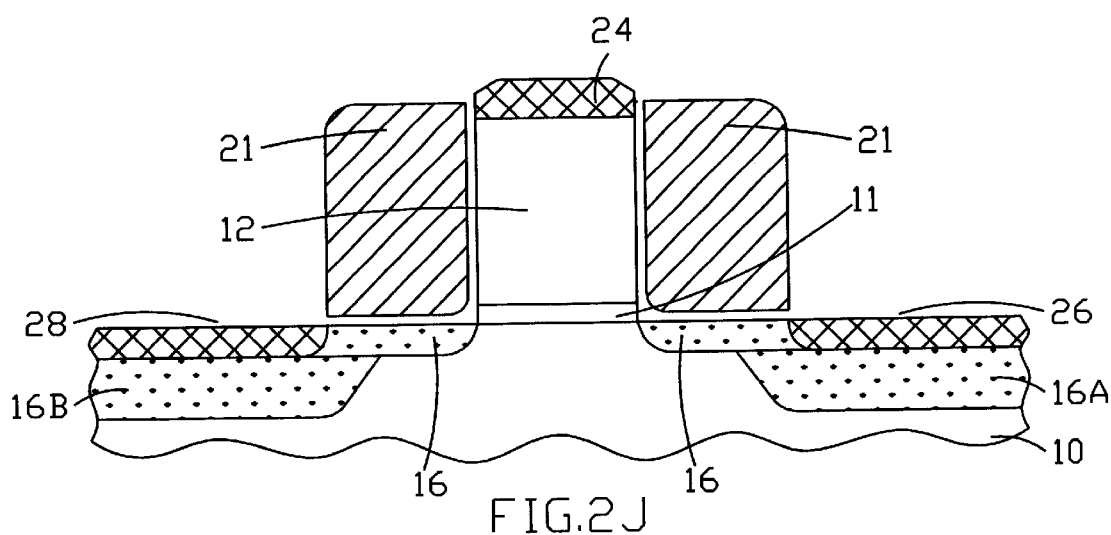

Referring to the so-called "metal sillicide process" shown from FIG. 2H to FIG. 2J, the key features of this process include: low resistivity, anti-electron migration, and high melting point. Metal silicide process is mainly applied on the formation of polycide structure, which is very effective in forming low resistivity ohmic contacts in between polysilicon and metal conductors, in reducing RC delay time, and in increasing device activation speed. Titanium, molybdenium, tantalum, tungsten, cobalt, etc. are the most commonly used elements for forming metal silicide. In the following, cobalt will be used as an example in depicting the process and the requirement of metal silicide.

FIG. 2H shows a cobalt metal layer 22 deposited onto the entire wafer surface to a thickness ranging from about 200 angstroms to 1000 angstroms by magnetron DC sputtering. Next, a high temperature between about 600 °C. and about 800 °C. is applied, and in the mean while, a portion of the deposited cobalt film has reacted with gate electrode's polysilicon and silicon of source/drain regions to form gate cobalt silicide 24, source region cobalt silicide 26, and drain region cobalt silicide 28, as is shown in FIG. 2I. In conclusion, unreacted cobalt and cobalt reaction product other than cobalt silicide are then removed by wet etching, thus leaving the final structure shown in FIG. 2J.

Although specific embodiments have been illustrated and described, it will be obvious to those skilled in the art that various modifications may be made without departing from what is intended to be limited solely by the appended claims.

What is claimed is:

1. A method for producing PMOS devices, said method comprising:

providing a n-type semiconductor substrate;

forming a gate oxide layer on said n-type semiconductor substrate;

forming a gate layer on said gate oxide layer;

patterning both said gate layer and said gate oxide layer to define a gate;

firstly implanting said n-type semiconductor substrate using said gate as a mask to form at least two high doped drain regions (HDDs), and forming a silicon nitride layer on top of the exposed surface of said gate and on said n-type semiconductor substrate, wherein said silicon nitride layer can be formed either before said semiconductor substrate is firstly implanted or after said semiconductor substrate is firstly implanted, wherein available dopants of said firstly implantation comprise boron and boron fluoride, and said silicon nitride layer could be used to prevent boron segregation and out diffusion;

forming a first dielectric layer on said silicon nitride layer;

forming a dielectric spacer on sidewall of said gate layer and said gate oxide layer by anisotropically etching portion of said first dielectric layer;

secondly implanting said n-type semiconductor substrate to form source/drain regions having a conductivity type opposite to the semiconductor substrate by using said gate and said dielectric spacer as a mask;

annealing the resulting structure;

etching isotroptically said silicon nitride layer, for reducing fringing capacitance; and forming silicide on said source/drain regions and said gate.

2. The method according to claim 1, wherein said gate layer comprises polysilicon.

3. The method according to claim 1, wherein said silicon nitride layer has a thickness from about 50 angstroms to about 150 angstroms.

4. The method according to claim 1, wherein the energy of said firstly implantation is in between about 0.5 and 8 keV.

5. The method according to claim 1, wherein said first dielectric layer comprises silicon oxide.

6. The method according to claim 1, wherein the solution for etching isotropically said silicon nitride layer comprises phosphoric acid.

* * * * *